United States Patent
van der Zanden et al.

(10) Patent No.: US 7,158,426 B2
(45) Date of Patent: Jan. 2, 2007

(54) METHOD FOR TESTING AN INTEGRATED SEMICONDUCTOR MEMORY

(75) Inventors: Koen van der Zanden, Heverlee (BE); Manfred Pröll, Dorfen (DE); Jörg Kliewer, München (DE); Björn Wirker, Mülsen (DE)

(73) Assignee: Infineon Technologies AG, Munich (DE)

(*) Notice: Subject to any disclaimer, the term of this patent is extended or adjusted under 35 U.S.C. 154(b) by 52 days.

(21) Appl. No.: 11/121,175

(22) Filed: May 4, 2005

(65) Prior Publication Data
US 2005/0249016 A1 Nov. 10, 2005

(30) Foreign Application Priority Data
May 6, 2004 (DE) ............ 10 2004 022 326

(51) Int. Cl.
*G11C 7/00* (2006.01)
*G11C 8/00* (2006.01)

(52) U.S. Cl. .............. 365/201; 365/203; 365/233; 365/236

(58) Field of Classification Search .......... 365/201, 365/203, 233, 236, 189.12
See application file for complete search history.

(56) References Cited

U.S. PATENT DOCUMENTS

| 5,912,850 | A * | 6/1999 | Wood et al. ............ 365/201 |
| 6,421,789 | B1 * | 7/2002 | Ooishi ..................... 714/7 |
| 6,546,503 | B1 * | 4/2003 | Ooishi ..................... 714/7 |
| 2002/0080677 | A1 | 6/2002 | Watanabe et al. |
| 2003/0142577 | A1 | 7/2003 | Kumazaki et al. |

* cited by examiner

*Primary Examiner*—Richard Elms
*Assistant Examiner*—Son T Dinh
(74) *Attorney, Agent, or Firm*—Edell, Shapiro & Finnan, LLC (57) ABSTRACT

An integrated semiconductor memory can be operated in a normal operating state synchronously with a control clock. In the test operating state, the integrated semiconductor memory is driven synchronously with a clock edge of the control clock with a first control signal and starts a test run independent of the control clock. Driving with the first control signal, selection transistors in a memory bank that can be selected by a memory bank address are turned off. Afterward, bit lines in the selected memory bank are interconnected and driven with a predetermined precharge potential. After a precharge time has elapsed, one of the word lines is selected by an applied word line address and the selection transistors in the selected memory bank connected to the selected word line are turned on. Precharge times are set and tested independently of the clock period of the control clock.

21 Claims, 3 Drawing Sheets

FIG 1

METHOD FOR TESTING AN INTEGRATED SEMICONDUCTOR MEMORY

CROSS REFERENCE TO RELATED APPLICATIONS

This application claims priority under 35 U.S.C. §119 to German Application No. DE 10 2004 022326.2, filed on May 6, 2004, and titled "Method for Testing an Integrated Semiconductor Memory" the entire contents of which are hereby incorporated by reference.

FIELD OF THE INVENTION

The invention relates to a method for testing an integrated semiconductor memory by precharge times for precharging bit lines can be tested.

BACKGROUND

Figure 1:
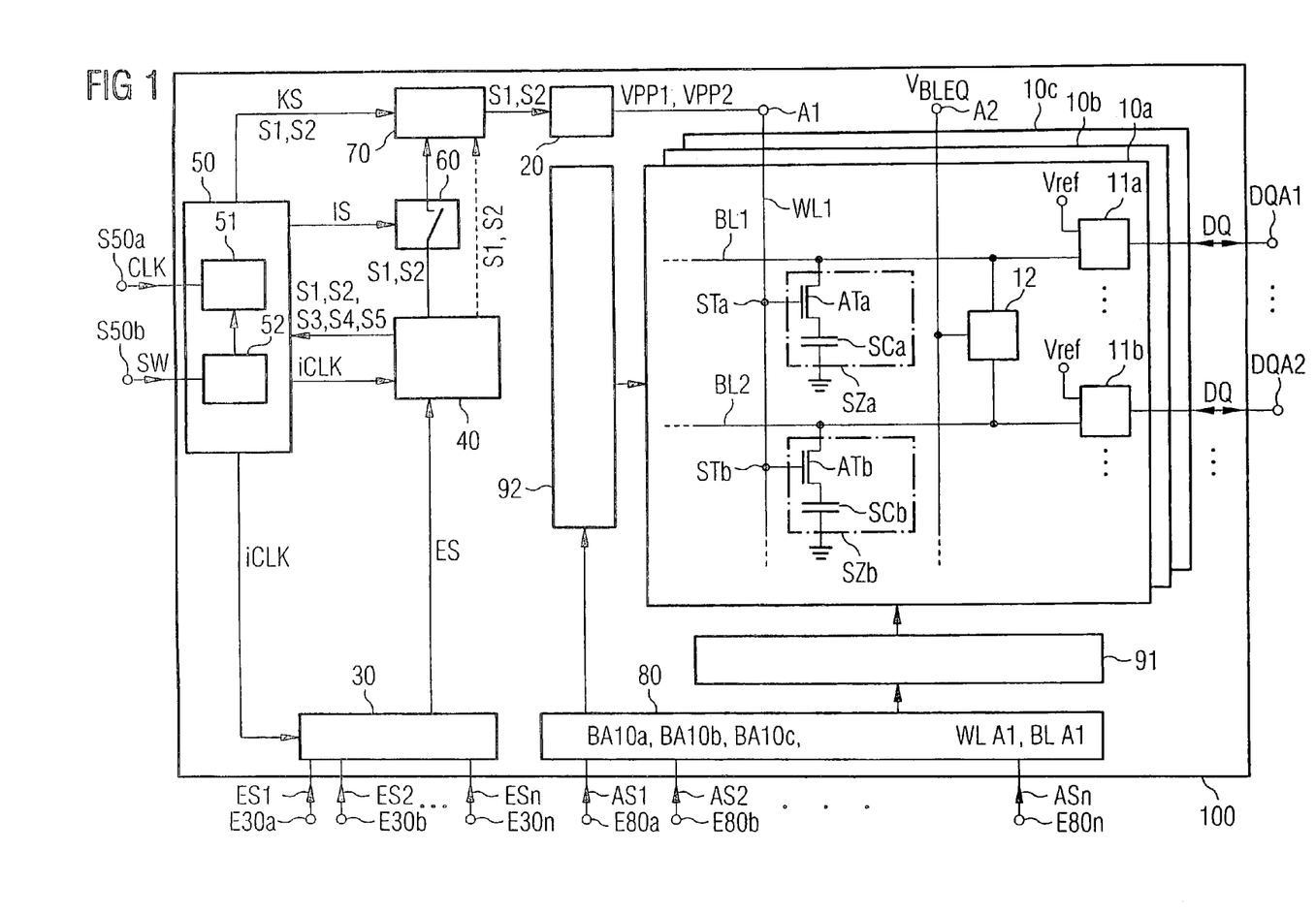
FIG. 1 shows an integrated semiconductor memory in accordance with the invention.

An integrated semiconductor memory, for example, a DRAM (dynamic random access memory) semiconductor memory, generally comprises a plurality of memory banks in which memory cells are arranged at a crossover point between a word line and a bit line. FIG. 1 shows an integrated semiconductor memory 100 with memory banks 10a, 10b, 10c. A small detail from a DRAM memory cell array is illustrated in the memory bank 10a. For simplicity, two memory cells SZa and SZb are illustrated in the memory cell array of the memory bank 10a. The memory cells comprise a selection transistor Ata, ATb and a storage capacitor SCa and SCb. The selection each have a control terminal STa, STb connected to a word line WL1. By driving the word line with a first level of a control voltage VPP1 or a second level of a control voltage VPP2, which are generated by a circuit 20 for generating the control voltage, the selection transistors of the memory cells, whose control terminals are connected to the word line, are turned off or turned on, respectively.

The bit lines BL1, BL2 are, respectively connected to a sense amplifier 11a and a sense amplifier 11b within the memory bank 10a. In addition, the sense amplifiers are each connected to a terminal for application of a reference voltage Vref. On the output side, the sense amplifiers are connected to data inputs and outputs DQA1, DQA2. In order to read an item of information into and out of a memory cell, the memory bank associated with the corresponding memory cell are selected and the word line connected to the control terminal of the memory cell. For this purpose, address signals AS1, AS2, . . . , ASn are applied to input terminals E80a, E80b, . . . , E80n of an address register 80. By the address signals AS1, AS2, . . . , ASn, a memory bank address BA10a, BA10b, BA10c for selecting the memory banks 10a, 10b, 10c and a word line address, for example a word line address WLA1 for selecting the word line WL1, and a bit line address, for example, a bit line address BLA1 for selecting the bit line BL1, in the address register 80 are stored. By a column decoder 91, the word line associated with the word line address WLA1 can be selected and driven with the control voltage VPP1 or VPP2. The bit line associated with the bit line address BLA1 can be selected by a row decoder 92. The memory cell located at the crossover point between the selected word and bit lines can be connected to one of the data inputs and data outputs for reading items of information in and out.

A write and read access to the memory cell SZa located at the crossover point of the word line WL1 and the bit line BL1 will be considered in greater detail below. By driving the word line WL1 with a high level of the control voltage VPP1, the selection transistor ATa of the memory cell SZa is turned on. If a logic 1 information item is intended to be written to the memory cell SZa, the sense amplifier 10a generates a high signal level on the bit line BL1, or a low signal level if a logic 0 information item is intended to be stored in the memory cell SZa. Accordingly, the storage capacitor SCa is charged to a high or a low signal level, respectively.

In order to read out an item of information from the memory cell SZa, all the storage capacitors of memory cells within the memory bank 10a are isolated from the associated bit lines. For example, if the memory cell SZa located in the memory bank 10a is intended to be read, then the memory bank 10a is selected by a memory bank address BA10a present at the address register 80. The word lines of the selected memory bank 10a are subsequently driven with a low level of the control voltage VPP2, so that the selection transistors of the memory cells are turned off. If the bit lines of the memory bank 10a are isolated from their associated memory cells, the bit lines are short-circuited among one another by a precharge circuit 12 and connected to a precharge potential $V_{BLEQ}$ via a terminal A2a of the memory bank 10a. After a defined precharge time, the bit lines of the memory bank 10a are charged to the common precharge potential $V_{BLEQ}$. This precharge procedure is intended to prevent an undefined potential state present on the bit lines from adversely influencing a subsequent read-out procedure for the storage capacitors of the memory cells.

After the defined precharge time has elapsed, the memory cell SZa is conductively connected to the bit line BL1 again. In this case, the word line WL1 in the memory bank 10a is selected by the memory bank address BA10a present at the address register 80 and the word line address WLA1. After driving the selected word line WL1 in the selected memory bank 10a with the high level of the control voltage VPP1, the selection transistor ATa is turned on and the storage capacitor SCa is conductively connected to the bit line BL1. The voltage level stored on the storage capacitor SCa generates a potential increase or potential decrease on the bit line BL1. The potential increase or decrease with respect to the precharge potential $V_{BLEQ}$ is amplified by the sense amplifier 11a through comparison with the reference voltage Vref to form a high or low signal level at the data output DQA1.

The integrated semiconductor memory 100 furthermore has a buffer circuit 30 with input terminals E30a, E30b, . . . E30n for applying input signals ES1, ES2, . . . , ESn. The input signals are control signals which are applied externally for controlling the integrated semiconductor memory and are buffer-stored in the buffer circuit 30. The integrated semiconductor memory furthermore has a control circuit 50 with a first control terminal S50a for applying a control clock CLK. The control circuit 50 generates an internal control clock iCLK from the externally applied control clock CLK, circuit components of the integrated semiconductor memory being driven with the internal control clock. In the case of a synchronously operated integrated semiconductor memory, for example, an SDRAM (synchronous dynamic random access memory) semiconductor memory, the input signals ES buffer-stored in the buffer circuit, when the buffer circuit 30 is driven with the internal control clock iCLK, upon rising and falling edges of the internal control clock in each clock period, are transferred to a command decoder circuit 40 and decoded there. After the input signals have been decoded, the command decoder circuit 40, depending on the input signal, generates a first control signal S1, a second control signal S2, a third control signal S3, a fourth control signal S4, and a fifth control signal S5, which drive the control circuit 50 upon a clock edge of the control clock CLK. The first and second control signals S1 and S2 are buffer-stored in a command register 70 when the command decoder circuit 40 is driven with the internal control clock. For this purpose, the command decoder circuit 40 is directly connected to the command register 70 via the signal path illustrated by a dashed line. The first and second control signals S1 and S2 are transferred to the command register 70 upon the clock edges of the internal control clock iCLK with which the command decoder circuit 40 is driven by the control circuit 50. The significance of the individual control signals will be discussed in more detail in the description of FIGS. 2 and 3.

From the control signals fed to the control circuit 50 by the command decoder circuit 40, the control circuit 50 generates an internal command signal KS, with which the command register 70 is driven, upon the rising clock edge of the control clock CLK. If, depending on the input signals ES1, . . . , ESn applied to the input terminals E30a, . . . , E30n, the first and second control signals S1 and S2 from the command decoder circuit 40 have been buffer-stored in the command register 70, by driving the command register 70 with an internal command signal KS, the control signals S1 and S2 buffer-stored in the command register 70 are fed to the circuit 20 for generating the control voltage VPP1 and VPP2 for controlling the selection transistors. The circuit 20 for generating the control voltage generates on the output side, the first level of the control voltage VPP1 and the second level of the control voltage VPP2, which is fed via a terminal A1 to the word line, selected by the word line address WLA, in the memory bank selected by the memory bank address BA. The first level VPP1 and the second level VPP2 of the control voltage serve for turning on and turning off, respectively, the selection transistors of the memory cells in the selected memory bank.

Figure 2:
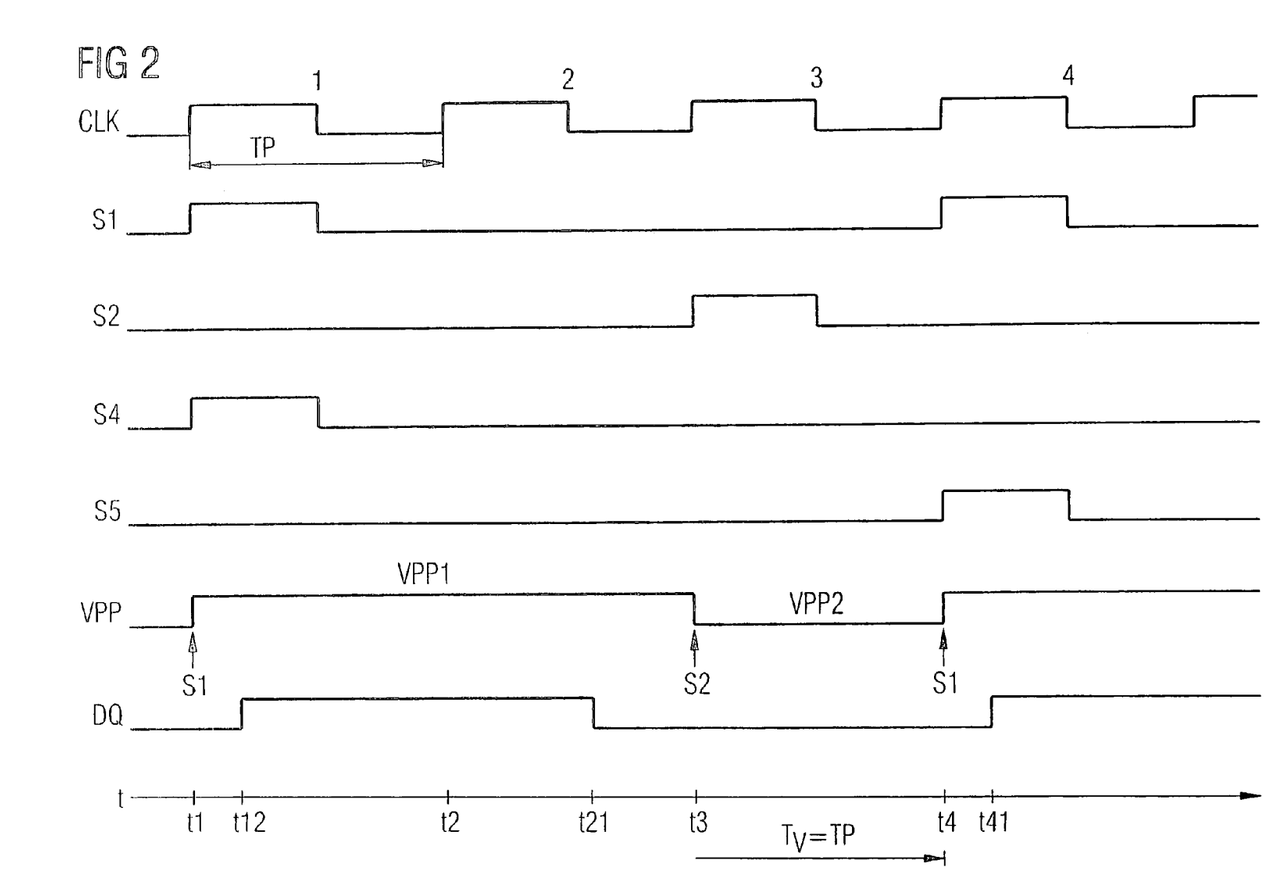
FIG. 2 shows a signal state diagram for testing a precharge time in accordance with the prior art.

FIG. 2 shows, in a signal state diagram, the control signals S1, S2, S4, S5 fed to the control circuit 50 by the command decoder circuit 40 during a write, precharge, and read procedure. In the event of a state change in the first control signal S1, the selection transistors connected to the selected word line in the selected memory bank are turned on. A state change in the second control signal S2 causes the selection transistors in the selected memory bank to be turned off. In the event of a state change in the fourth control signal S4, an item of information is written to a memory cell. In the event of a state change in the fifth control signal S5, an item of information is read out from a memory cell.

FIG. 2 furthermore illustrates four clock periods of the control clock CLK having the period duration TP. Moreover, the profile of the control voltage VPP and the profile of the data signals DQ present at the data inputs and outputs are also illustrated besides the profile of the control signals.

In the first clock period 1 of the control clock, a write access is effected, which is indicated to the control circuit 50 by the command decoder circuit 40 by means of the state change in the fourth control signal S4. The first control signal S1 is transferred into the command register 70 by the command decoder circuit 40. Upon a clock edge of the external control clock CLK, the control circuit 50 drives the command register 70 with the command signal KS. The first control signal S1 buffer-stored in the command register 70 thereupon drives the circuit 20 for generating the control voltage VPP. As a result, the selection transistors that are connected via their respective control terminals to a selected word line in a selected memory bank are turned on in order that an item of information can be stored in at least one of the memory cells. The selected word line is therefore driven with the high level of the control voltage VPP1 by the circuit 20 for generating the control voltage VPP at the instant t1, which corresponds to the rising clock edge of the control clock CLK. At the instant t12 during the first clock period of the control clock CLK, data signals DQ are applied to the data inputs. Upon the rising clock edge at the beginning of the second clock period 2 of the control clock at the instant t2, no control signals are applied to the control circuit 50. The read-in procedure for the data signals DQ is concluded at the instant t21 within the second clock cycle of the control clock. At the beginning of the third clock period 3 of the control clock at the instant t3, the selection transistors that were turned on for the read-in procedure in the selected memory bank are turned off again as a result of the control circuit 50 being driven with the second control signal S2 by the command decoder circuit 40. The second control signal S2 is transferred into the command register 70 by the command decoder circuit 40. Upon a clock edge of the external control clock CLK, the control circuit 50 drives the command register 70 with the command signal KS. The second control signal S2 buffer-stored in the command register 70 thereupon drives the circuit 20 for generating the control voltage VPP. The circuit 20 for generating the control voltage VPP thereupon drives the word lines in the selected memory bank with the low level of the control voltage VPP2. In the third clock period, the precharge procedure can thus be effected in that the bit lines which are now isolated from their connected memory cells are short-circuited among one another by means of the precharge circuit 12 and are driven with the precharge potential $V_{BLEQ}$. The bit lines in the selected memory bank are thus charged to the common precharge potential $V_{BLEQ}$. Upon the rising clock edge of the control clock at the beginning of the fourth clock period 4 at the instant t4, a read-out procedure from at least one memory cell is effected. This is indicated to the control circuit 50 by the state change in the fifth control signal S5. As a result of the state change in the first control signal S1 upon the rising clock edge at the beginning of the fourth clock period of the control clock, the selection transistors that are connected via the respective control terminals to the selected word line in the selected memory bank are turned on. For this purpose, the control circuit 50 drives the command register 70 with the internal command signal KS again upon the rising clock edge of the control clock in the fourth clock period. The first control signal S1 buffer-stored in the command register 70 thereupon drives the circuit 20 for generating the control voltage VPP, as a result of which the word line selected by means of the corresponding word line address is driven with the high level of the control voltage VPP1 by the circuit 20 for generating the control voltage VPP. At the instant t41 within the fourth clock period of the control clock, the data signals DQ in accordance with the items of information stored in the memory cells to be read occur at the data outputs.

It becomes clear from the state diagram illustrated in FIG. 2 that, in the case of the synchronously operated integrated semiconductor memory, the control circuit 50 executes control procedures that are required for writing items of information to memory cells, for precharging bit lines, and for reading from memory cells, always upon rising clock edges of the control clock CLK. If a synchronously operated semiconductor memory is intended to be tested, clock signals CLK are predefined externally by a test system at the first control terminal S50a of the control circuit 50. However, since control procedures for write, precharge and read procedures in a memory bank of the integrated semiconductor memory are initiated by the control circuit 50 only upon rising clock edges of the control clock or only in each case during a clock period of the control clock, the minimum time between a precharge command, for example, the state change in the second control signal S2 at the beginning of the third clock period of the control clock, and a subsequent read command, for example, the state change in the first control signal S1 and in the fifth control signal S5 at the beginning of the fourth clock period of the control clock, is dependent on the maximum possible clock rate of the test system.

The precharge times $T_V$ of an integrated semiconductor memory, in particular, constitute an important time parameter to be specified. The precharge time is the time required to charge the bit lines of a memory bank to the common precharge potential $V_{BLEQ}$. The precharge procedure is generally initiated after a write or read procedure in the selected memory bank in order that a subsequent write or read procedure is not influenced by an undefined potential state on the bit lines in the selected memory bank. The precharge time $T_V$ can thus also be defined as the time between closing the selection transistors that are still turned on from a preceding write or read access and a renewed turn-on of the selection transistors for a subsequent write or read access.

In the testing of integrated semiconductor memories, a distinction is generally made between low-end test systems and high-end test systems. Low-end test systems are generally used to test the effects of ageing processes on the functionality of the integrated semiconductor memory. Such low-end test systems have the advantage that they enable a parallel testing of many semiconductor memories simultaneously. The required test times and also the required test costs associated therewith can be reduced as a result.

Low-end test systems have the disadvantage, however, that they are subject to limitations with regard to the clock rate. In test systems having a parallel capability, the clock rate of the control clock generated by the tester is nowadays of an order of magnitude of 5 MHz. The period duration TP of a clock period thus becomes greater than 200 ns. Such testers can be used to test time parameters, such as the precharge times for example, only with a minimum possible time duration of 200 ns. Since the precharge times in present-day memory modules are generally already specified below 12 ns, however, low-end test systems can no longer be used for testing this critical time parameter or generally have to be furnished with additional equipment that is expensive or has a reduced parallel capability.

A further possibility for testing the specified precharge times consists in using high-end test systems. Such test systems operate at a high frequency and are generally used for very precise time parameter measurements. However, parallel testing of modules is generally not possible with these high-end test systems.

A further limitation of these test systems results from the fact that quite generally only the maximum and also the minimum specification temperature can be tested with the high-end testers. However, a test pass with a low-end test system typically starts with room temperature tests, and even a test having a duration of several minutes is still cost-tenable on account of the parallel capability of the low-end tester. Since the memory modules are also operated at approximately room temperature and for a long time in the applications envisaged for them, a low-end test system having a parallel capability can therefore generally realize test conditions which come significantly closer to the use of the memory modules in an application than is possible with high-end test systems. It is desirable, therefore, to be able to use the low-end testers also for testing particularly short time durations, such as precharge times of less than 12 ns, for example.

SUMMARY

A method for testing an integrated semiconductor memory of the present invention can critically test very short time durations, in particular, time durations for precharge procedures. Further, an integrated semiconductor memory in which very short time durations can critically test, in particular, of precharge procedures, without the use of expensive test systems.

A method for testing an integrated semiconductor memory includes providing an integrated semiconductor memory which can be operated in a test operating state, which has a register for reading in a threshold value, a counter, and at least one memory bank with at least one word line, with bit lines and with memory cells. The memory cells each have a storage capacitor and a selection transistor, which can be controlled by driving one of the word lines in one of the memory banks with a control voltage. The respective memory bank and the respective word line can be selected for driving one of the word lines in one of the memory banks. The respective storage capacitors of the memory cells can be connected to a respective one of the bit lines by turning on the respective selection transistors of the memory cells. In the test operating state, a control circuit is driven synchronously with a clock edge of a control clock with a first control signal, so that a test including selecting one of the memory banks, and turning off the selection transistors in the selected memory bank by driving the word lines in the selected memory bank with the control voltage. Then conductively connecting the bit lines in the selected memory bank to one another and driving the bit lines with a precharge potential for a precharge time duration to be tested. The precharge time duration to be tested is set independently of a duration of a clock period of the control clock. Next, altering a counter reading of the counter proceeding from a start value until the threshold value read into the register is reached. The time duration between the start value and reaching the threshold value represents a precharge time duration to be tested. Then, selecting one of the word lines. Next, turning on the selection transistors, which can be controlled by the driving of the selected word line in the selected memory bank, by driving the selected word line in the selected memory bank with the control voltage after the precharge time to be tested has elapsed.

In one implementation of the method for testing an integrated semiconductor memory, the bit lines in the selected memory bank are interconnected and driven with a precharge potential for a precharge time duration to be tested. The precharge time duration to be tested is shorter than a clock period of the control clock.

In a further features of the method for testing an integrated semiconductor memory, the selection transistors, which can be controlled by driving the selected word line in the selected memory bank, are turned on by driving the selected word line in the selected memory bank with a first level of the control voltage. Furthermore, the selection transistors in the selected memory bank are turned off by driving the word lines in the selected memory bank with a second level of the control voltage.

In another feature of the method for testing an integrated semiconductor memory, the integrated semiconductor memory is provided, in which case the latter can also be operated in a normal operating state. In the normal operating state, the control circuit is driven synchronously with the clock edge of the control clock with the first control signal, so that a control procedure including selection one of the memory banks and one of the word lines and turning on the selection transistors which can be controlled by the driving of the selected word line in the selected memory bank by driving the selected word line in the selected memory bank with the first level of the control voltage.

In a further feature of the method for testing an integrated semiconductor memory, the control circuit is driven in the normal operating state synchronously with the clock edge of the control clock with a second control signal. A control procedure includes selecting one of the memory banks and turning off the selection transistors in the selected memory bank by driving the word lines in the selected memory bank with the second level of the control voltage. The bit lines in the selected memory bank are then interconnected and driven with the precharge potential for a precharge time duration in the normal operating state. The precharge time duration in the normal operating state includes one or a plurality of clock periods of the control clock.

In the normal operating state, the integrated semiconductor memory is operated synchronously by the control circuit. This means that, in each case, upon a rising or falling clock edge, a control signal is read in and the associated control procedure is initiated. A precharge procedure is initiated in the normal operating state of the integrated semiconductor memory by driving the control circuit with the first control signal. As a result, the selection transistors which are connected to the selected word line via their respective control terminals are operated such that they are turned off. The precharge operation of the bit lines can be started by the bit lines being short-circuited among one another and being connected to the precharge potential. The renewed turning on of the selection transistors by means of the driving of the selected word line in the selected memory bank with the corresponding control voltage ends the precharge operation. However, since the selection transistors are turned on by driving the control circuit with the second control signal, which is applied to the integrated semiconductor memory synchronously with the rising or falling clock edge of the control clock, the precharge time that can be set in the normal operating state of the integrated semiconductor memory is dependent on the length of the clock period of the control clock. The minimum precharge time that can be set is thus predefined by the maximum possible clock rate of the control clock.

In contrast to the normal operating state of the integrated semiconductor memory, the integrated semiconductor memory is driven only with a single control signal, the first control signal, in the test operating state for the activation of the precharge operation. If the control circuit detects the first control signal in the test operating state of the integrated semiconductor memory, although it turns off the selection transistors in the selected memory bank likewise synchronously with the rising or falling clock edge of the control clock, the renewed turning on of the selection transistors which can be controlled by means of the driving of the selected word line in the selected memory bank is effected asynchronously with respect to the rising and falling clock edges of the control clock. After the precharge time to be tested has elapsed, the control circuit turns the selection transistors on again without renewed driving of the control circuit with a control signal. It is thus possible to realize or test precharge times that are independent of the length of the clock period of the control clock.

Precharge times that are shorter than a clock period of the control clock are preferably tested. The testing of precharge times of the integrated semiconductor memory in the test operating state is thus independent of the clock period of the control clock.

In another embodiment of the method for testing an integrated semiconductor memory, the integrated semiconductor memory is operated first in the normal operating state and is subsequently changed over into the test operating state by driving the control circuit with a third control signal.

In another implementation, the method for testing an integrated semiconductor memory provides for providing the integrated semiconductor memory, in which one of the memory banks can be selected by applying a memory bank address. The memory bank address is applied during the driving of the control circuit in the test operating state with the first control signal.

According to a further implementation of the method according to the invention for testing an integrated semiconductor memory, an integrated semiconductor memory, in which one of the word lines in the selected memory bank can be selected by applying a word line address is provided. The word line address is applied during the driving of the control circuit in the test operating state with the first control signal.

In a further refinement of the method for testing an integrated semiconductor memory, the integrated semiconductor memory is used with an address register for applying an address. An address is applied to the address register during the driving of the control circuit in the test operating state with the first control signal, the address including the memory bank address and the word line address.

According to another feature of the method for testing an integrated semiconductor memory, the integrated semiconductor memory is provided with a circuit for generating the control voltage, which is driven with the first control signal for the purpose of generating the first level of the control voltage and with the second control signal for the purpose of generating the second level of the control voltage. The circuit for generating the control voltage is driven by the control circuit with the first control signal for the purpose of turning off the selection transistors in the selected memory bank. For turning on the selection transistors, which can be controlled via the selected word line in the selected memory bank, the circuit for generating the control voltage is driven by the control circuit with the second control signal.

In the normal operating state of the integrated semiconductor memory, the control circuit may be driven with the first control signal for the purpose of writing a data value to at least one of the memory cells whose respective selection transistor can be controlled by the driving of the selected word line in the selected memory bank. In order to read out a data value from at least one of the memory cells whose respective selection transistor can be controlled by the driving of the selected word line in the selected memory bank, the control circuit may be driven with the first control signal in the normal operating state of the integrated semiconductor memory.

An integrated semiconductor memory by which the problem can likewise be solved is specified below. The integrated semiconductor memory can be operated in a test operating state synchronously and asynchronously with a clock edge of a control clock. The integrated semiconductor memory include at least one memory bank with at least one word line with bit lines and with memory cells. The memory cells each have a storage capacitor and a selection transistor, which can be controlled by driving one of the word lines in one of the memory banks with a control voltage. The respective memory bank and the respective word line can be selected for driving one of the word lines in one of the memory banks. The respective storage capacitors of the memory cells can be connected to a respective one of the bit lines by turning on the respective selection transistors of the memory cells. The integrated semiconductor memory according to the invention furthermore has a control circuit for controlling the integrated semiconductor memory. The control circuit including a register for storing a threshold value and a counter with a variable counter reading. The control circuit is designed such that, in the test operating state, due to driving the control circuit with a first control signal, the first control signal is applied synchronously with the clock edge of the control clock. The control circuit turns off the selection transistors in the selected memory bank by driving the word lines in the selected memory bank with the control voltage. Furthermore the control circuit is designed such that, in the test operating state, during the driving of the control circuit with the first control signal, the control circuit alters the counter reading of the counter proceeding from a start value until the counter reading has reached the threshold value stored in the register. The control circuit is furthermore designed such that subsequently, for a precharge time duration to be tested, which can be predefined independently of a duration of a clock period of the control clock, the control circuit connects the bit lines in the selected memory bank and connects the bit lines to a terminal for applying a precharge potential until the counter reading has reached the threshold value stored in the register. The control circuit is furthermore designed such that the control circuit turns on the selection transistors which can be controlled by the driving of the selected word line in the selected memory bank, by driving the selected word line in the selected memory bank with the control voltage, if the counter reading has reached the threshold value stored in the register.

According to a further feature of the integrated semiconductor memory, the control circuit is designed such that, in the test operating state, due to the driving of the control circuit with the first control signal, the control circuit generates a second control signal synchronously with the clock edge of the control clock, so that the selection transistors of the selected memory bank are turned off. The control circuit is furthermore designed such that, in the test operating state, due to the driving of the control circuit with the first control signal, the control circuit generates the first control signal after the precharge time to be tested has elapsed, asynchronously with the clock edge of the control clock, so that the selection transistors, which can be controlled by the driving of the selected word line in the selected memory bank, are turned on.

In accordance with a further design feature, the integrated semiconductor memory according to the invention comprises a circuit for generating the control voltage. In this case, the circuit for generating the control voltage is designed such that, in the case of driving with the first control signal, it generates a first level of the control voltage for turning on the selection transistors. Furthermore the circuit for generating the control voltages is, for example, designed such that, in the case of driving with the second control signal, it generates a second level of the control voltage for turning off the selection transistors.

According to a further circuit design according to the invention, the integrated semiconductor memory includes an address register with address terminals for applying an address, which includes a memory bank address for selecting one of the memory banks and a word line address for selection of one of the word lines. In this case, the control circuit may be designed such that, in the test operating state, due to driving of the control circuit with the first control signal synchronously with the clock edge of the control clock, the control circuit evaluates the applied address and, based on the memory bank address contained therein, selects one of the memory banks and, based on the word line address contained therein, selects one of the word lines for driving the selected word line with the control voltage.

According to a further circuit concept, the integrated semiconductor memory can be operated in a normal operating state synchronously with the clock edge of the control clock. In the case of this configuration variant, the control circuit for controlling the integrated semiconductor memory is designed such that, in the normal operating state, due to the driving of the control circuit with the first control signal, the control circuit generates a command signal, so that the circuit for generating the control voltage drives the selected word line in the selected memory bank synchronously with the clock edge of the control clock with the first level of the control voltage, so that the selection transistors, which can be controlled by the driving of the selected word line in the selected memory bank are turned on. Furthermore the control circuit for controlling the integrated semiconductor memory is preferably designed in such a way that, in the normal operating state, due to the driving of the control circuit with the second control signal, the control circuit generates the command signal, so that the circuit for generating the control voltage drives the selected word line in the selected memory bank synchronously with the clock edge of the control clock with the second level of the control voltage, so that the selection transistors, which can be controlled by the driving of the selected word line in the selected memory bank, are turned off.

The control circuit may be designed such that, in the normal operating state, the control circuit switches the integrated semiconductor memory to the test operating state as a result of the driving of the control circuit with a third control signal.

BRIEF DESCRIPTION OF THE DRAWINGS

The invention is explained in more detail below with reference to figures which show exemplary embodiments of the invention, in which.

DETAILED DESCRIPTION

Since the circuit components of an integrated semiconductor memory which are required for a precharge procedure in accordance with the prior art have already been described with reference to FIG. 1, additional circuit components provided for testing short precharge times with low-end test systems in accordance with the invention are discussed here. The changes reside essentially in the configuration of the control circuit 20 and in the use of a controllable switch 60. In the normal operating state of the integrated semiconductor memory, the controllable switch 60 is closed, thereby again producing the direct connection between the command decoder circuit 40 and the command register 70 as described in the prior art. In the normal operating state, the method of operation of the integrated semiconductor memory corresponds to the operating mode described in the prior art.

In contrast to the above-described arrangement of the circuit components of the integrated semiconductor memory, which corresponds to the previous prior art, the command decoder circuit 40 in accordance with the invention is no longer connected to the command register 70 via the signal path illustrated in dashed fashion. Instead, the controllable switch 60 is connected between the command decoder circuit 40 and the command register 70.

Figure 3:
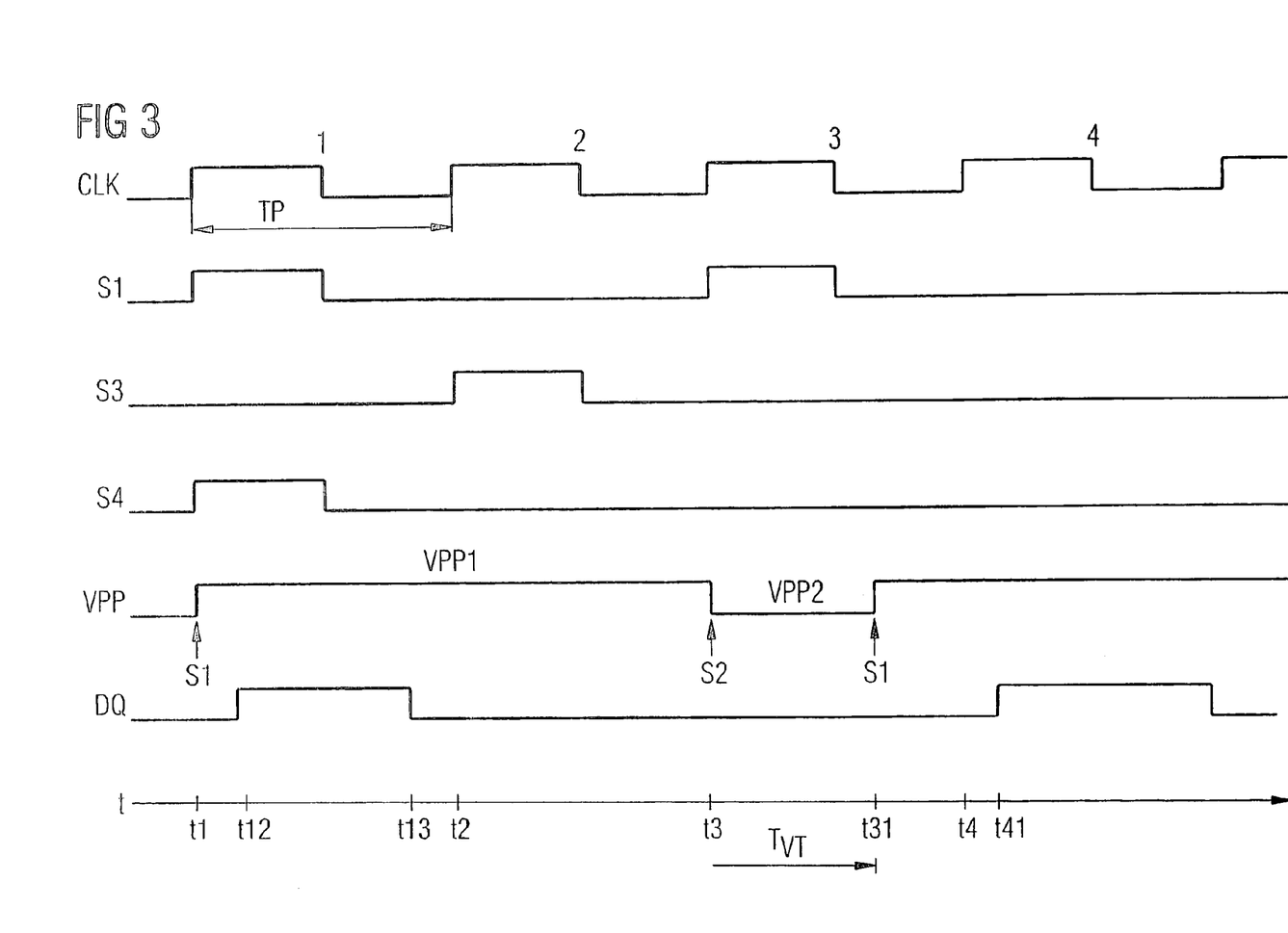
FIG. 3 shows a signal state diagram for testing very short precharge times in accordance with the invention.

The control circuit 50 of the integrated semiconductor memory according to the invention additionally has, besides the first control terminal S50a for applying the control clock CLK, a second control terminal S50b for reading in a threshold value SW. In this case, the threshold value SW represents a measure of the precharge time to be tested and is read into a register 52. The control circuit 50 additionally has a counter 51. The counter 51 is a binary counter, for example. The functioning of the control circuit 50 and of the additional circuit components, of the counter 51 and of the register 52, is explained below with reference to the signal state diagram illustrated in FIG. 3. FIG. 3 shows the signal profile of the first control signal S1, of a third control signal S3 and of the fourth control signal S4 and also the profile of the control voltage VPP and the profile of data signals DQ. For better comparison with FIG. 2, FIG. 3 also again illustrates four clock cycles of the period duration TP of the control clock CLK. An occurrence of a state change of the first control signal S1 again effects a turning on of selection transistors which are connected for control to the selected word line in the selected memory bank.

The memory bank can be selected by the applying one of the memory bank addresses BA10a, BA10b and BA10c to the input terminals of the address register 80. Likewise, the word line selected for driving the selection transistors of the memory cells can be selected by the applying a corresponding word line address, for example, the word line address WLA1 for selection of the word line WL1, to the input terminals of the address register 80.

In the event of the driving of the control circuit 50 with a state transition of the third control signal S3, the control circuit 50 operates the integrated semiconductor memory 100 in a test operating state. In this test operating state, the control circuit 50 for controlling the integrated semiconductor memory no longer operates strictly synchronously with the clock edges of the control clock CLK, but rather initiates control operations for controlling write, precharge and read accesses to the integrated semiconductor memory both at the beginning of a clock period of the control clock and within the same clock period of the control clock. In the event of a state change of the fourth control signal S4, the integrated semiconductor memory is configured for a write access by the control circuit 50. The signal row designated by VPP in FIG. 3 shows the driving of the selected word line with the first and the second level of the control voltage VPP1 and VPP2. A state change of the data signals DQ from a low to a high signal level indicates the presence of data signals at the data inputs and data outputs DQA1 and DQA2.

At the beginning of the first clock period 1, when the rising clock edge of the control clock occurs at the instant t1, the integrated semiconductor memory is driven by a first and fourth external input signal ES1 and ES4 at its input terminals E30a and E30d. The two external input signals are decoded by the command decoder circuit 40 and translated into the two internal control signals S1 and S2. The control circuit 50 is subsequently driven with the first control signal S1 and the fourth control signal S4 by the command decoder circuit 40. The integrated semiconductor memory is thereby configured for a write access by the control circuit 50. By the address AS1, AS2, . . . , ASn present at the same instant at the input terminals E80a, E80b, . . . , E80n of the address register 80, which address includes a memory bank address BA10 and a word line address WLA, the control circuit 50 selects one of the memory banks, for example, the memory bank 10a in the case where the memory bank address BA10a is present, and a word line in the selected memory bank, for example the word line WL1 in the case where the word line address WLA1 is present. The selection transistors connected to this word line by their control terminals are subsequently turned on. For this purpose, the circuit 20, after driving with the first control signal S1 for generating the control voltage VPP, generates the high level of the control voltage VPP1. As a result, the selection transistors of the memory cells are turned on. The data signals present at the data inputs DQA1 and DQA2 at the instant t12 to the instant t13 within the first clock period are thus written to the memory cells in the selected memory bank via the turned-on selection transistors.

Afterward, the integrated semiconductor memory is driven by a first external input signal ES3 at its input terminal E30c. The external input signal ES3 is decoded by the command decoder circuit 40 and translated into the internal control signal S3. At the beginning of the second clock period 2 of the control clock, the control circuit 50 is driven with the third control signal S3 at the instant of the rising clock edge of the control clock CLK at the instant t2. From then on the control circuit 50 operates the integrated semiconductor memory in the test operating state.

At the instant t3, the integrated semiconductor memory is driven synchronously with the control clock CLK by the first external input signal ES1 at its input terminal E30a. The external input signal ES1 is decoded by the command decoder circuit 40 and translated into the internal control signal S1. The control circuit 50 is subsequently driven with the first control signal S1. In contrast to the driving of the control circuit 50 with the first control signal S1 in the normal operating state, the driving of the control circuit 50 with the first control signal S1 in the test operating state causes the selection transistors in the selected memory bank to be turned off. For this purpose, the control circuit 50 drives the circuit 20 for generating the control voltage VPP with the second control signal S2 via the command register 70. Since, for a precharge procedure, the selection transistors in the selected memory bank are operated such that the selection transistors are turned off, from the address present at the address register 70 only the memory bank address is evaluated at the beginning of the third clock period of the control clock. The associated memory bank in which the selection transistors are operated such that the selection transistors are turned off is selected by the memory bank address. In order to turn off the selection transistors, the circuit 20 for generating the control voltage generates the low level of the control voltage VPP2 and thus drives all the word lines in the selected memory bank. At the same time, the bit lines which are insulated from the memory cells by the selection transistor operated such that it is turned off are connected via the precharge circuit 12 to the terminal A2 for application of the precharge potential $V_{BLEQ}$. The bit lines within the selected memory bank can thus be charged to the precharge potential $V_{BLEQ}$. With the beginning of the precharge operation, the control circuit 50 alters the current counter reading of the counter 51 until the threshold value stored in the register 52 is reached. The period of time from turning off the selection transistors at the instant t3 until reaching the threshold value stored in the register 52 corresponds to the precharge time $T_{VT}$ to be tested.

At the instant t31, which identifies the end instant of the precharge time $T_{VT}$ to be tested, the circuit 20 for generating the control voltage VPP drives one of the word lines within the selected memory bank with the high level of the control voltage VPP1. In order to generate the high level of the control voltage VPP1, it is driven with the first control signal S1 by the control circuit 50 via the command register 70. In order to select the corresponding word line, the control circuit then also evaluates the word line address WLA from the address present at the address register 80. By the word line address WLA1, for example, it is thus possible to select the word line WLA1 in the selected memory bank for driving the selection transistors.

It can be discerned with reference to FIG. 3 that, unlike in the normal operating state, in which the integrated semiconductor memory is operated synchronously with the clock edges of the control clock, the end of the precharge time no longer lies at the beginning of a clock period of the control clock, but rather within one of the clock periods. In order to realize particularly short precharge times, the threshold value is set in such a way that the end instant lies within the same clock period at the beginning of which the precharge procedure was started. Consequently, in contrast to the normal operating state of the integrated semiconductor memory, precharge times, which are shorter than a clock period of the control clock, can be tested because the precharge time to be tested can be read into the register 52, arbitrary precharge times independent of the minimum possible clock period of a connected test system are possible.

After the precharge time $T_{VT}$ to be tested has elapsed at the instant t31, the selection transistors AT that can be driven via the selected word line are turned on again by driving with the first level of the control voltage VPP1. After a short delay time, the data signals DQ corresponding to the items of information stored in the memory cells SZ occur at the data outputs DQA1 and DQA2 at the instant t41 within the fourth clock period of the control clock.

In the test operating state, it is possible further to use the same control signals, for example the first control signal S1, which was also used in the normal operating state of the integrated semiconductor memory for the purpose of turning on selection transistors. In contrast to the normal operating state, however, the control circuit 50 interprets the first control signal S1 in the test operating state as a start signal for testing the precharge times. Therefore, the control signal S1 is not forwarded directly to the command register 70 from the command decoder circuit 40. Instead, the connection between the command decoder circuit 40 and the command register 70 is isolated in the test operating state. For this purpose, the controllable switch 60 is driven by a corresponding state of an internal control signal IS, which controls the controllable switch 60 at high impedance. An additional control signal is no longer required for the subsequent test steps, that is to say the reading in and evaluation of the word line address and also the turning on of the selection transistors that can be controlled via the selected word line. Instead, the control circuit 50 drives the circuit 20 for generating the control voltage VPP independently with the first and second control signals S1 and S2 via the command register 70. It generates the second control signal S2 upon the rising clock edge of the control clock at the beginning of the third clock period. Due to the driving with the second control signal S2 by the control circuit 50, the circuit 20 for generating the control voltage, as also in the case of driving with the second control signal S2 by the command decoder circuit 40 in the normal operating state, generates the low level of the control voltage VPP2. As a result, the selection transistors in the selected memory bank are turned off. After the precharge time to be tested has elapsed, the control circuit 50 generates the first control signal S1 independently of the clock edge of the control clock that is currently present at the first control terminal S50*a* and drives the circuit 20 for generating the control voltage VPP with the first control signal S1 via the command register 70. On account of the driving of the circuit 20 for generating the control voltage VPP with the first control signal S1 by the control circuit 50, it generates, as also in the case of driving with the first control signal S1 by the command decoder circuit 40 in the normal operating state, the high level of the control voltage VPP1 for the purpose of turning on the selection transistors which are connected to the selected word line in the selected memory bank. The integrated semiconductor memory is thus operated in the test operating state independently of the clock period TP of the control clock CLK that is generated by the tester.

The test method according to the invention for testing the precharge times of the integrated semiconductor memory makes it possible, for example, to test whether the set precharge time to be tested was sufficient for the data value read in the first clock period of the control clock to be read out correctly again during the fourth clock period of the control clock. If the data record previously stored in the memory cells SZ is read out erroneously after the precharge time to be tested, then an individual defective memory cell may be involved, but also for example a defective sense amplifier, for example the sense amplifier 11*a*. In order to distinguish a defective individual cell from a defective sense amplifier, it is possible, within the test run for testing the precharge times, for not just one word line but successively a plurality of word lines to be selected by their associated word line addresses. If erroneous data signals DQ occur in this case only at a specific data output, for example, the data output DQA1, which is connected to the first bit line BL1, then it is possible to infer a bit-line-oriented defect or a defect in the sense amplifier 11*a* connected to the bit line BL1.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS:

10 Memory bank
11 Sense amplifier
12 Precharge circuit
20 Circuit for generating the control voltage
30 Buffer circuit
40 Command decoder circuit
50 Control circuit
51 Counter
52 Register
60 Controllable switch
70 Command register 80 Address register
91 Column decoder
92 Row decoder
A Terminal of the memory cell array
AT Selection transistor
BL Bit line
CLK Control clock
DQ Data signal
DQA Data input and data output
E Input terminal
ES Input signal
IS Internal control signal
KS Command signal
S Control terminal
S1, . . ., S5 Control signals
SC Storage capacitor
ST Control terminal
SW Threshold value
SZ Memory cell
TP Clock period
$T_V$ Precharge time
$T_{VT}$ Precharge time to be tested
$T_{BLEQ}$ Precharge potential
VPP Control voltage
Vref Reference voltage
WL Word line

What is claimed is:

1. A method for testing an integrated semiconductor memory, comprising:
providing an integrated semiconductor memory which can be operated in a test operating state, the integrated semiconductor memory including a register for reading in a threshold value, a counter, and at least one memory bank with at least one word line with bit lines and memory cells, the memory cells each having a storage capacitor and a selection transistor, the selection transistor being controlled by driving one of the word lines in one of the memory banks with a control voltage, the respective memory bank and the respective word line selected for driving one of the word lines in one of the memory banks, the respective storage capacitors of the memory cells being connected to a respective one of the bit lines by turning on the respective selection transistors of the memory cells; and
driving a control circuit in the test operating state synchronously with a clock edge of a control clock with a first control signal, so that a test includes
selecting one of the memory banks,
turning off the selection transistors in the selected memory bank by driving the word lines in the selected memory bank with the control voltage,
connecting the bit lines in the selected memory bank and driving the bit lines with a precharge potential for a precharge time duration to be tested, the precharge time duration to be tested being set independently of a duration of a clock period of the control clock,
altering a counter reading of the counter proceeding from a start value until the threshold value read into the register is reached, the time duration between the start value and reaching the threshold value representing a precharge time duration to be tested,
selecting one of the word lines, and
turning on the selection transistors by driving the selected word line in the selected memory bank with the control voltage, after the precharge time to be tested has elapsed.

2. The method for testing an integrated semiconductor memory as claimed in claim 1, further comprising:
connecting the bit lines in the selected memory bank and driving the bit line with a precharge potential for a precharge time duration to be tested, the precharge time duration to be tested being shorter than a clock period of the control clock.

3. The method for testing an integrated semiconductor memory as claimed in claim 1, further comprising:
turning on the selection transistors by driving the selected word line in the selected memory bank, with a first level of the control voltage; and
turning off the selection transistors in the selected memory bank by driving the word lines in the selected memory bank with a second level of the control voltage.

4. The method for testing an integrated semiconductor memory as claimed in claim 1, further comprising:
providing the integrated semiconductor memory which can be operated in a normal operating state; and
driving the control circuit in the normal operating state synchronously with the clock edge of the control clock with the first control signal, so that a control procedure includes
selecting one of the memory banks and one of the word lines,
turning on the selection transistors by driving the selected word line in the selected memory bank with the first level of the control voltage.

5. The method for testing an integrated semiconductor memory as claimed in claim 1, further comprising:
driving the control circuit in the normal operating state synchronously with the clock edge of the control clock with a second control signal, so that a control procedure includes
selecting one of the memory banks,
turning off the selection transistors in the selected memory bank by driving the word lines in the selected memory bank with the second level of the control voltage,
connecting the bit lines in the selected memory bank, and driving the bit lines with the precharge potential for a precharge time duration in the normal operating state, the precharge time duration in the normal operating state includes one or a plurality of clock periods of the control clock.

6. The method for testing an integrated semiconductor memory as claimed in claim 1, further comprising:
changing over the integrated semiconductor memory from the normal operating state to the test operating state by driving the control circuit with a third control signal.

7. The method for testing an integrated semiconductor memory as claimed in claim 1, further comprising:
selecting one of the memory banks of the integrated semiconductor memory by applying a memory bank address; and
applying the memory bank address when driving the control circuit in the test operating state with the first control signal.

8. The method for testing an integrated semiconductor memory as claimed in claim 7, further comprising:

selection one of the word lines in the selected memory bank of the integrated semiconductor memory by applying a word line address; and applying the word line address when driving of the control circuit in the test operating state with the first control signal.

9. The method for testing an integrated semiconductor memory as claimed in claim 8, further comprising:

providing the integrated semiconductor memory with an address register for applying an address; and applying an address to the address register when driving the control circuit in the test operating state with the first control signal, the address including the memory bank address and the word line address.

10. The method for testing an integrated semiconductor memory as claimed in claim 1, further comprising:

providing the integrated semiconductor memory with a circuit for generating the control voltage, the circuit being driven with the first control signal for generating the first level of the control voltage and with the second control signal for generating the second level of the control voltage;

driving the circuit for generating the control voltage by the control circuit with the first control signal for turning off the selection transistors in the selected memory bank; and driving the circuit for generating the control voltage by the control circuit with the second control signal for turning on the selection transistors controlled via the selected word line in the selected memory bank.

11. The method for testing an integrated semiconductor memory as claimed in claim 1, further comprising:

driving the control circuit in the normal operating state with the first control signal for writing a data value to at least one of the memory cells, the respective selection transistor of being controlled by the driving the selected word line in the selected memory bank; and driving the control circuit in the normal operating state with the first control signal for reading out a data value from at least one of the memory cells, the respective selection transistor being controlled by driving the selected word line in the selected memory bank.

12. An integrated semiconductor memory, which can be operated in a test operating state synchronously and asynchronously with a clock edge of a control clock, comprising:

at least one memory bank with at least one word line, bit lines, and memory cells, the memory cells each having a storage capacitor and a selection transistor, the selection transistor being controlled by driving one of the word lines in one of the memory banks with a control voltage, in which the respective memory bank and the respective word line are selected for driving one of the word lines in one of the memory banks, the respective storage capacitors of the memory cells are connected to a respective one of the bit lines by turning on the respective selection transistors of the memory cells; and a control circuit for controlling the integrated semiconductor memory, in which the control circuit including a register for storing a threshold value and a counter with a variable counter reading, the control circuit designed such that, in the test operating state, due to driving the control circuit with a first control signal, the first control signal is applied synchronously with the clock edge of the control clock, the control circuit turns off the selection transistors in the selected memory bank by driving the word lines in the selected memory bank with the control voltage, the control circuit further designed such that, in the test operating state, when driving the control circuit with the first control signal, control circuit alters the counter reading of the counter proceeding from a start value until the counter reading has reached the threshold value stored in the register, the control circuit connecting the bit lines in the selected memory bank and connecting the bit lines to a terminal for applying a precharge potential until the counter reading has reached the threshold value stored in the register, the control circuit turning on the selection transistors controlled by driving the selected word line in the selected memory bank, with the control voltage, if the counter reading has reached the threshold value stored in the register.

13. The integrated semiconductor memory as claimed in claim 12, wherein in the test due to the driving of the control circuit with the first control signal, the control circuit generates a second control signal synchronously with the clock edge of the control clock, so that the selection transistors (ATa, ATb) of the selected memory bank are turned off, and the control circuit with the first control signal, said control circuit generates the first control signal after the precharge time to be tested has elapsed, asynchronously with the clock edge of the control clock, so that the selection transistors (ATa, ATb) controlled by the driving of the selected word line in the selected memory bank are turned on.

14. The integrated semiconductor memory as claimed in claim 12, further comprising:

a circuit (20) for generating the control voltage (VPP1, VPP2), wherein, in the case of driving with the first control signal, in which the circuit (20) for generating the control voltages (VPP1, VPP2) generates a first level of the control voltage (VPP1) for turning on the selection transistors, and wherein, in the case of driving with the second control signal (S2), the circuit for generating the control voltages generates a second level of the control voltage (VPP2) for turning off the selection transistors.

15. The integrated semiconductor memory as claimed in claim 12, further comprising:

an address register (70) with address terminals (E70a, E70b, . . . , E70n) for applying an address (AS1, AS2, . . . , ASn), the register includes a memory bank address (BA10a) for selecting one of the memory banks (10a) and a word line address (WLA1) for selecting one of the word lines (WL1), wherein, in the test operating state, due to the driving of the control circuit with the first control signal (S1) synchronously with the clock edge of the control clock, the control circuit evaluates the applied address and, based on the memory bank address (BA10a) therein, the control circuit selects one of the memory banks (10a) and, based on the word line address (WLA1) therein, the control circuit selects one of the word lines (WL1) for driving the selected word line with the control voltage (VPP1, VPP2).

16. The integrated semiconductor memory as claimed in claim 13, which can be operated in a normal operating state synchronously with the clock edge of the control clock, wherein in the normal operating state, due to the driving the control circuit with the first control signal (S1), the control circuit for controlling the integrated semiconductor memory generates a command signal (KS), so that the circuit (20) for generating the control voltage (VPP1, VPP2) drives the selected word line in the selected memory bank synchronously with the clock edge of the control clock with the first level of the control voltage (VPP1), so that the selection transistors (ATa, ATb) controlled by the driving of the selected word line (WL1) in the selected memory bank are turned on, and driving the control circuit with the second control signal (S2), the control circuit for controlling the integrated semiconductor memory generates the command signal (KS), so that the circuit (20) for generating the control voltage (VPP1, VPP2) drives the selected word line in the selected memory bank synchronously with the clock edge of the control clock with the second level of the control voltage (VPP2), so that the selection transistors (ATa, ATh) controlled by driving the selected word line (WL1) in the selected memory bank are turned off.

17. The integrated semiconductor memory as claimed in claim 12, wherein, in the normal operating state the control circuit (50) switches the integrated semiconductor memory to the test operating state as a result of driving the control circuit with a third control signal (S3).

18. The method for testing an integrated semiconductor memory as claimed in claim 7, further comprising:

providing the integrated semiconductor memory with a circuit (20) for generating the control voltage (VPP1, VPP2), the circuit being driven with the first control signal (S1) for generating the first level of the control voltage (VPP1) and with the second control signal (S2) for generating the second level of the control voltage (VPP2);

driving the circuit (20) for generating the control voltage (VPP1, VPP2) by the control circuit (50) with the first control signal (S1) for turning off the selection transistors in the selected memory bank; and driving the circuit (20) for generating the control voltage (VPP1, VPP2) by the control circuit (50) with the second control signal (S2) for turning on the selection transistors controlled via the selected word line in the selected memory bank.

19. The method for testing an integrated semiconductor memory as claimed in claim 7, further comprising:

driving the control circuit (50) in the normal operating state with the first control signal (S1) for writing a data value (DQ) to at least one of the memory cells (SZa, SZb), the respective selection transistor (ATa, ATb) of being controlled by the driving the selected word line (WL1) in the selected memory bank (10a); and driving the control circuit (50) in the normal operating state with the first control signal (S1) for reading out a data value (DQ) from at least one of the memory cells (SZa, SZb), the respective selection transistor (ATa, ATb) being controlled by driving the selected word line (WL1) in the selected memory bank (10a).

20. The integrated semiconductor memory as claimed in claim 14, which can be operated in a normal operating state synchronously with the clock edge of the control clock, wherein in the normal operating state, due to the driving the control circuit with the first control signal (S1), the control circuit for controlling the integrated semiconductor memory generates a command signal (KS), so that the circuit (20) for generating the control voltage (VPP1, VPP2) drives the selected word line in the selected memory bank synchronously with the clock edge of the control clock with the first level of the control voltage (VPP1), so that the selection transistors (ATa, ATb) controlled by the driving of the selected word line (WL1) in the selected memory bank are turned on, and driving the control circuit with the second control signal (S2), the control circuit for controlling the integrated semiconductor memory generates the command signal (KS), so that the circuit (20) for generating the control voltage (VPP1, VPP2) drives the selected word line in the selected memory bank synchronously with the clock edge of the control clock with the second level of the control voltage (VPP2), so that the selection transistors (ATa, ATb) controlled by driving the selected word line (WL1) in the selected memory bank are turned off.

21. The integrated semiconductor memory as claimed in claim 15, which can be operated in a normal operating state synchronously with the clock edge of the control clock, wherein in the normal operating state, due to the driving the control circuit with the first control signal (S1), the control circuit for controlling the integrated semiconductor memory generates a command signal (KS), so that the circuit (20) for generating the control voltage (VPP1, VPP2) drives the selected word line in the selected memory bank synchronously with the clock edge of the control clock with the first level of the control voltage (VPP1), so that the selection transistors (ATa, ATb) controlled by the driving of the selected word line (WL1) in the selected memory bank are turned on, and driving the control circuit with the second control signal (S2), the control circuit for controlling the integrated semiconductor memory generates the command signal (KS), so that the circuit (20) for generating the control voltage (VPP1, VPP2) drives the selected word line in the selected memory bank synchronously with the clock edge of the control clock with the second level of the control voltage (VPP2), so that the selection transistors (ATa, ATh) controlled by driving the selected word line (WL1) in the selected memory bank are turned off.

* * * * *

UNITED STATES PATENT AND TRADEMARK OFFICE
CERTIFICATE OF CORRECTION

PATENT NO. : 7,158,426 B2 Page 1 of 1
APPLICATION NO. : 11/121175
DATED : January 2, 2007
INVENTOR(S) : van der Zanden et al.

It is certified that error appears in the above-identified patent and that said Letters Patent is hereby corrected as shown below:

Col. 19, line 16: replace "ATh" with -- ATb --.

Col. 20, line 52: replace "ATh" with -- ATb --.

Signed and Sealed this

First Day of April, 2008

JON W. DUDAS
*Director of the United States Patent and Trademark Office*